(12) United States Patent
Ellison et al.

(10) Patent No.: US 9,470,868 B2
(45) Date of Patent: Oct. 18, 2016

(54) ULTRA-HIGH DENSITY FRAMES

(71) Applicant: Telect, Inc., Liberty Lake, WA (US)

(72) Inventors: Steven W. Ellison, Mead, WA (US); David Knaggs, Spokane, WA (US); Spencer Williams, Liberty Lake, WA (US)

(73) Assignee: Telect, Inc., Liberty Lake, WA (US)

( * ) Notice: Subject to any disclaimer, the term of this patent is extended or adjusted under 35 U.S.C. 154(b) by 0 days.

(21) Appl. No.: 14/698,456

(22) Filed: Apr. 28, 2015

(65) Prior Publication Data

US 2015/0309278 A1    Oct. 29, 2015

Related U.S. Application Data

(60) Provisional application No. 61/985,361, filed on Apr. 28, 2014.

(51) Int. Cl.
*G02B 6/44* (2006.01)

(52) U.S. Cl.
CPC .......... *G02B 6/4452* (2013.01); *G02B 6/4453* (2013.01); *G02B 6/4454* (2013.01); *G02B 6/4455* (2013.01); *G02B 6/4459* (2013.01)

(58) Field of Classification Search
CPC  G02B 6/4452; G02B 6/4453; G02B 6/4454; G02B 6/4455; G02B 6/4459

USPC .......................................................... 385/135
See application file for complete search history.

(56) References Cited

U.S. PATENT DOCUMENTS

| | | | | |
|---|---|---|---|---|
| 5,339,379 A | * | 8/1994 | Kutsch | G02B 6/4452 385/135 |
| 5,758,002 A | * | 5/1998 | Walters | G02B 6/4452 385/134 |
| 6,556,761 B1 | * | 4/2003 | Jennings | G02B 6/4452 385/134 |
| 2004/0146266 A1 | * | 7/2004 | Solheid | G02B 6/4452 385/135 |
| 2008/0145013 A1 | * | 6/2008 | Escoto | G02B 6/4472 385/135 |
| 2009/0310929 A1 | * | 12/2009 | Reinhardt | G02B 6/4453 385/135 |
| 2013/0028567 A1 | * | 1/2013 | Parikh | G02B 6/4455 385/135 |
| 2013/0089292 A1 | * | 4/2013 | Ott | G02B 6/4471 385/78 |
| 2014/0270676 A1 | * | 9/2014 | Ott | G02B 6/4452 385/135 |
| 2015/0309674 A1 | | 10/2015 | Williams et al. | |

\* cited by examiner

*Primary Examiner* — Ryan Lepisto
(74) *Attorney, Agent, or Firm* — Lee & Hayes, PLLC

(57) ABSTRACT

A total front access double sided frame includes a first access side opposite a second access side, and fiber blocks received in the first and second access sides. The fiber blocks may include splice modules and patch modules and have capacity to receive about 6,900 fiber terminations.

23 Claims, 12 Drawing Sheets

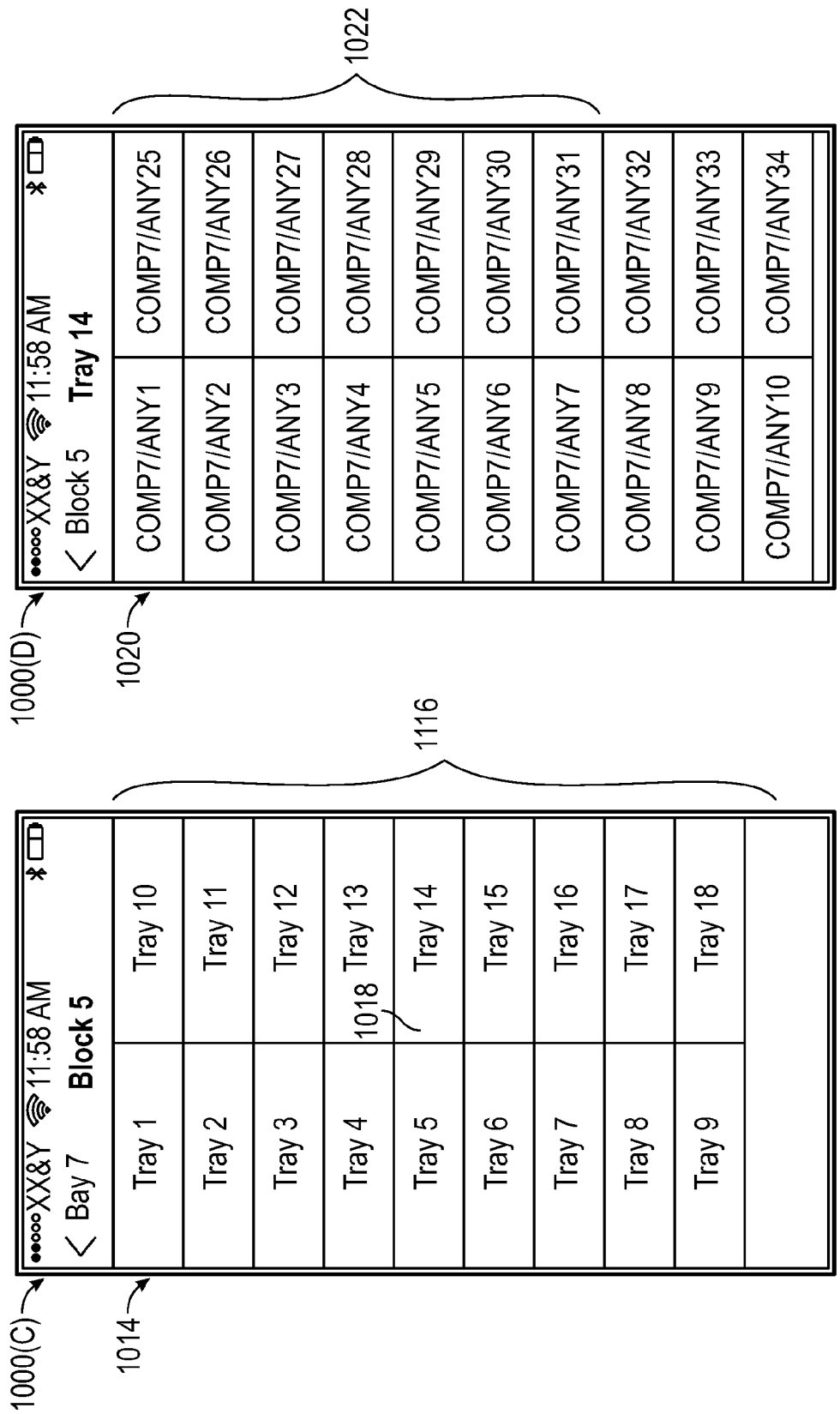

ULTRA-HIGH DENSITY FRAMES

CROSS REFERENCE TO RELATED APPLICATIONS

This Application claims priority to U.S. Provisional Patent Application No. 61/985,361, filed Apr. 28, 2014, which application is incorporated by reference herein in its entirety.

BACKGROUND

An important consideration in data communication equipment is circuit density. Most central data communication locations have limited space. Therefore, there is a need to reduce the size of data communication equipment, and install as much data communication equipment as possible in a relatively small space at a central data communication location.

For data communication manufacturers, making high density frames can be a challenging process in which engineers develop frames to meet the high density needs of the central data communication locations while protecting communication lines, maintaining bend radii of the communication lines, and managing massive amounts of the communication lines. This is particularly true for optical fiber communication lines, where the engineers create total front access (TFA) frames having a high density of optical fibers. Frames exist having a high density capacity of about 3,000 fiber terminations per frame, but the frames are not TFA, and instead require access to the backs of the frames. For example, in the case where the frame has a high density capacity of about 3,000 fiber terminations per frame, the splices are done at the back of the frame. Thus, a user must first splice cables at the back of the frame, and then traverse around a plurality of frames (e.g., a row of frames) to get to the front of the frame to patch the cables at the front of the frame the user is working on.

Moreover, when higher density capacities of fiber terminations are involved, the frames may be a dedicated splicing only frame or a dedicated patching only frame, resulting in a higher quantity of frames, and consuming more space. Further, when higher density capacities of fiber terminations are involved, footprints of the frames can become uncommon (i.e., not a standard size), resulting in uncommon space consumption in data communication locations. For example, when higher density capacities of fiber terminations are involved, a 23-inch mount (58-centimeter mount) frame may be designed to have a footprint of a width about 30 inches (76 centimeters) and a depth of about 24 inches (61 centimeters), which may be an uncommon footprint size used in central data communication locations and may be difficult to utilize with other existing frames and/or in relatively small spaces at the central data communication locations.

SUMMARY

Data communication apparatus are described which are configured to have a high density of fiber terminations per frame (e.g., 3000 or more), are total front access (TFA), and have a common footprint (e.g., a width of about 30 inches (76 centimeters) and a depth of about 36 inches (91 centimeters). Generally, the data communication apparatus include a total front access frame having fiber termination modules that provide for splicing and patching the high volume of fiber terminations, while protecting the fibers and maintaining bend radii of the fibers. This summary is provided to introduce simplified concepts of ultra-high density data communication frames, which are further described below in the Detailed Description. This summary is not intended to identify essential features of the claimed subject matter, nor is it intended for use in determining the scope of the claimed subject matter.

In some examples, a data communication apparatus includes a double sided frame having a first access side opposite a second access side, and first and second pluralities of fiber blocks received in the first and second access sides. In some examples, the first and second pluralities of fiber blocks may have capacity to receive at least about 4,000 fiber terminations. In some examples, the first and second pluralities of fiber blocks may have capacity to receive at least about 6,900 fiber terminations. The first and second pluralities of fiber blocks may include splice modules and patch modules.

In other examples, a data communication apparatus includes a frame having a first access face opposite a second access face. The first access face of the frame may be arranged to receive fiber termination modules in a left side column of the first access face of the frame and to receive fiber termination modules in a right side column of the first access face of the frame. And, the second access face of the frame may be arranged to receive fiber termination modules in a left side column of the second access face of the frame and receive fiber termination modules in a right side column of the second access face of the frame. Further, the data communication apparatus may include first and second fiber access management bays arranged between the left and right side columns of the first and second access faces of the frame.

In another example, a data communication apparatus includes a chassis having a height of at least about 10 rack units (RUs) to at most about 12 RUs and arranged to be received by a first access side of a frame or a second access side of the frame opposite the first access side of the frame. A plurality of splice trays and/or patch trays may be received in the chassis and arranged to receive a quantity of fiber terminations.

In another example, a method for managing connectivity information may include receiving a machine-readable code arranged with a fiber block, and presenting information of a plurality of trays of the fiber block, via a Graphical User Interface (GUI). The GUI may display connectivity information of fiber terminations arranged in a selected tray of the fiber block.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

FIGS. 10(A), 10(B), 10(C), and 10(D) illustrate example interfaces for managing connectivity information.

DETAILED DESCRIPTION

Overview

Figure 1:
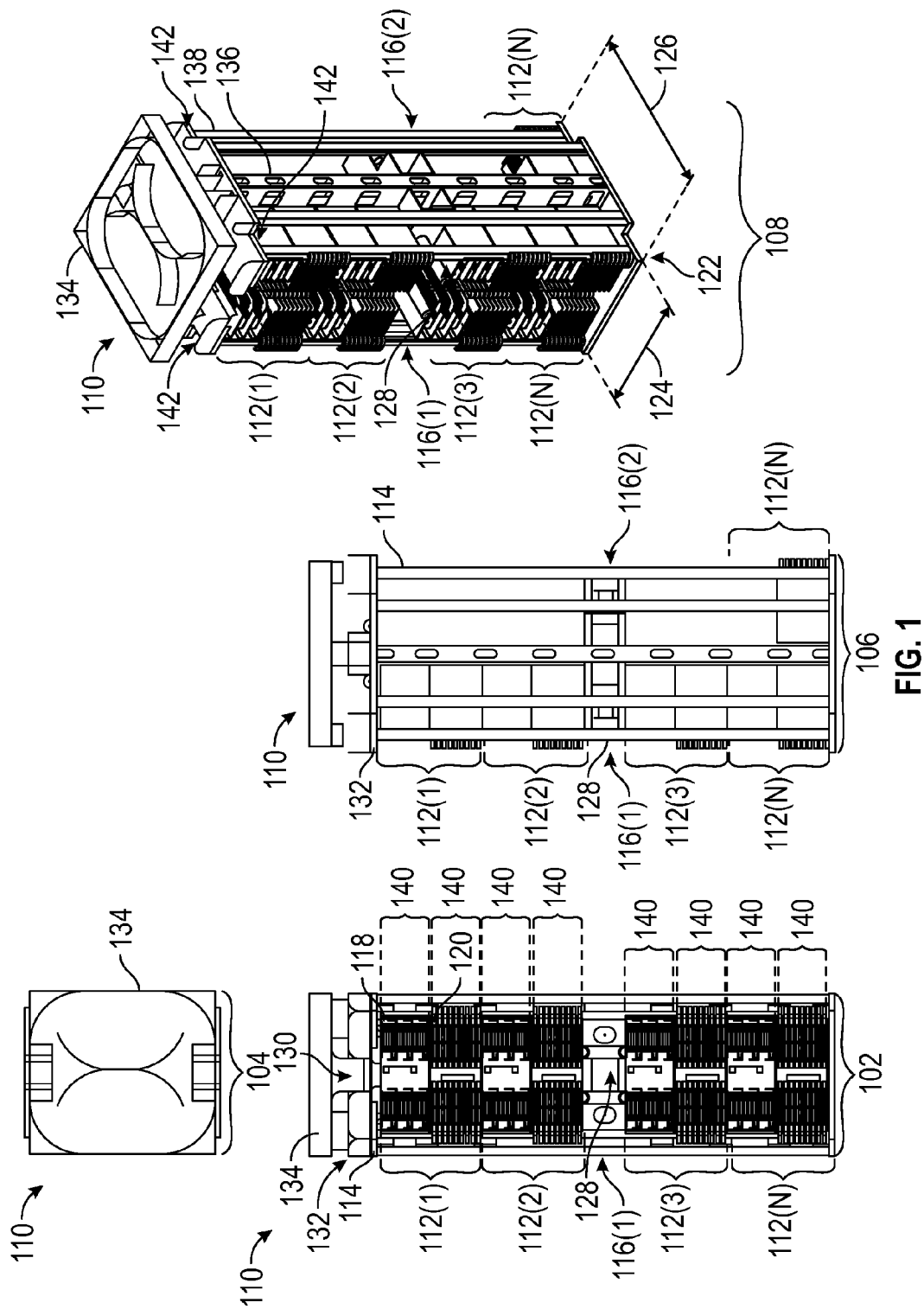
FIG. 1 illustrates a front view, a top view, a side view, and a perspective view of an example data communication apparatus having fiber blocks received in a frame.

This disclosure is directed to data communication apparatus having fiber blocks arranged in total front access frames, fiber termination modules, and methods of managing connectivity information. For example, data communication apparatus may include a total front access (TFA) frame having first and second access sides and a plurality of fiber blocks arranged in the first and/or second access sides. In other words, each access side may provide access to all of the fibers/connections housed in that side so that a user need not gain access to both sides of the apparatus in order to patch or splice a cable. The fiber blocks arranged in the first and/or second access sides may include a plurality of fiber termination modules. For example, a plurality of splice modules and/or a plurality of patch modules may be arranged in the fiber blocks. The plurality of splice modules may include a plurality of splice trays displaceably received in the splice modules. The plurality of patch modules may include a plurality of patch trays displaceably received in the patch modules. Because the fiber blocks may include a plurality of displaceably splice trays and/or displaceable patch trays a user may splice and patch cables at the first access side of the frame and/or splice and patch cables at the second access side of the frame without traversing around a plurality of frames (e.g., a row of frames) to get to an opposite side of a frame.

In another example, fiber termination modules may be arranged in left and right side columns of the first and second access faces of the frame, and fiber management bays may be arranged between the left and right side columns of the first and second access faces. For example, a plurality of splice modules and/or a plurality of patch modules may be arranged in columns of the first and second access faces of the frame. Because the fiber termination modules may be arranged in left and right side columns of the first and second faces of the frame, cable management bays may be arranged between the left and right side columns. In addition, the cable management bays may have capacity to receive at least about 4,000 fiber terminations—at least about 6,900 fiber terminations in some examples. Because the cable management bays receive fiber terminations between the fiber termination modules, the fiber termination modules may be accessed at the first and second faces of the frame to splice and/or patch the fiber terminations received by the cable management bays.

In another example, a top and/or bottom profile of the frame may have four notches or channels that provide and constitute part of a fiber routing/storage area. For example, the frame may have a cross shaped top and/or bottom profile and when frames are arranged adjacent to each other (e.g., in a row of frames), the neighboring notches of the two cross shaped top and/or bottom profiles of the frames constitute a fiber routing/storage area between the adjacent frames. Stated another way, each frame may have a first half of a fiber routing/storage area, and when first and second halves arranged together the first and second halves form a fiber routing/storage area between adjacent frames. In some examples, a spool may be arranged in the first half and/or in the second half for storing and/or routing fiber cables.

In another example, a machine-readable code may be associated with a frame, a fiber block, a fiber termination module, and/or a tray. The machine-readable code may provide for managing connectivity information of the data communication locations and/or data communication apparatuses. For example, a user may scan the machine-readable code using a mobile device (e.g., hand scanner, smart phone, PDA, tablet, etc.). Upon receiving a machine-readable code arranged on or near a fiber block, a Graphical User Interface (GUI) may present information of a plurality of trays of the fiber block. While the machine-readable code is described as being arranged on or near a fiber block, the machine-readable code may be arranged on a wall, a post, a column, a floor, a map etc. proximate or adjacent to a fiber block. Moreover, upon receiving an indication of a selection of a tray (e.g., by user selection of a graphic of the UI representing the tray), the GUI may display connectivity information of fiber terminations arranged in the selected tray. In this way, a user (e.g., an installer, a technician, a manager, an information systems technician, etc.) may manage the ultra-high density of fiber cables associated with the data communication apparatus. For example, because the frames of the data communication apparatus have capacity to receive at least about 4,000 fiber terminations—at least about 6,900 fiber terminations in some examples—labeling real estate in the frames may be limited, and machine-readable codes may be used to provide connectivity information for the massive amounts of fiber terminations in the frames.

Illustrative Data Communication Apparatuses

FIG. 1 illustrates a front view 102, a top view 104, a side view 106, and a perspective view 108 of an example data communication apparatus 110 having fiber blocks 112(1), 112(2), 112(3), and 112(N) received in a frame 114. For example, the frame 114 may having a first access side 116(1) opposite a second access side 116(2), and a first plurality of fiber blocks 112(1)-112(N) received in the first access side of the frame, and a second plurality of fiber blocks (not shown) received in the second access side of the frame. The first and second pluralities of fiber blocks 112(1)-112(N) may collectively have a capacity to receive at least about 4,000 fiber terminations. For example, the frame may receive about 4 fiber blocks in the first access side 116(1) and about 4 fiber blocks in the second access side 116(2), and each of the fiber blocks may have a capacity to receive at least about 500 fiber terminations. In another example, the frame may receive about 4 fiber blocks in the first access side 116(1) and about 4 fiber blocks in the second access side 116(2), and each of the fiber blocks may have a capacity to receive at least about 900 fiber terminations. Moreover, the first plurality of fiber blocks 112(1)-112(N) received in the first access side 116(1) of the frame 114 may splice and patch about half of the fiber terminations, and the second plurality of fiber blocks 112(1)-112(N) in the second access side 116(2) of the frame 114 may splice and patch about the other half of the fiber terminations. In one example, each of the fiber blocks may have a capacity to receive at least about 864 fiber terminations. Fiber terminations may be splice termination and/or patch terminations. A splice termination may be two separate fibers (e.g., separate pieces of glass) being joined together through a splice (e.g., joining two fibers end-to-end). A patch termination may be separate fibers (e.g., separate cables) terminated in a connector (e.g., Lucent Connectors (LCs), subscriber connectors (SC), etc.)) having an end condition (e.g., an angle-polished connector (APC) end condition or an ultra-polished connector (UPC) end condition). In the patch termination, the separate fibers terminated in the connector may then be inserted into an adapter (e.g., a coupler), where the adapter may provide for an additional cable to be inserted into the opposite end providing a continuous path for light to pass through. In this example, where each of the fiber blocks may have a capacity to receive at least about 864 fiber terminations, the first and second pluralities of fiber blocks 112(1)-112(N) may have a capacity to receive at least about 6,900 fiber terminations. In another example, each of the first and second pluralities of fiber blocks 112(1)-112(N) may have capacity to hold at least about 500 fiber terminations. In another example, each of the first and second pluralities of fiber blocks 112(1)-112(N) may have capacity to hold at least about 850 fiber terminations.

Front view 102 of FIG. 1 illustrates the first and second pluralities of fiber blocks 112(1)-112(N) may include splice modules 118 and patch modules 120. (Discussed in more detail with reference to FIG. 2). In one example, each of the plurality of fiber blocks 112(1)-112(N) may have a width of about 23 inches (58 centimeters) and a height of at least about 10 rack units (RUs) to at most about 12 RUs. FIG. 1 illustrates the frame 114 may have a footprint 122 having a width 124 of about 30 inches (76 centimeters) and a depth 126 of about 36 inches (91 centimeters).

FIG. 1 illustrates the data communication apparatus 110 may include at least one pass-through 128. For example, the at least one pass-through 128 may be arranged from the first access side 116(1) to the second access side 116(2) to provide for passing fiber cables received at the first access side 116(1) to the second access side 116(2), and/or passing fiber cables received by the second access side 116(2) to the first access side 116(1). While FIG. 1 illustrates the pass-through 128 being arranged substantially in a middle of the height of the frame, the pass-through 128 may be arranged at any location along the height of the frame. Further, the data communication apparatus 110 may include at least one pass-through 130 arranged from a top 132 of the frame 114 to the first access side 116(1) and/or to the second access side 116(2). For example, the frame 114 may have a pass-through 130 arranged from the top 132 of the frame 114 to the first access side 116(1) to provide for passing fiber cables received at the top 132 of the frame 114 to the first access side 116(1), and pass-through arranged from the top 132 of the frame 114 to the second access side 116(2) to provide for passing fiber cables received at the top 132 of the frame 114 to the second access side 116(2). In another example, the data communication apparatus 110 may include a cable unit 134 secured above the at least one pass-through 130 on the top 132 of the frame 114 to provide storage of at least a portion of fiber cables. For example, fiber cables may be received by the cable unit 134 from fiber troughs (not shown) arranged above the cable unit 134 and the fiber cables may be passed through the cable unit 134 to the pass-through arranged with the first and second access sides 116(1) and 116(2). In this way the fiber cables received by the data communication apparatus 110 may be made accessible at the first and second access sided 116(1) and 116(2). Thus, total front access to the fiber cables is provided by the data communication apparatus 110.

In another example, the frame 114 may meet Zone 4 seismic specifications. For example, the frame may include primary load baring posts 136 that are positioned substantially in a middle of the right and left sides of the frame 114, and secondary load bearing posts 138. Specifically, in a Zone 4 geographic area, there is a one in ten chance of experiencing a seismic event having an acceleration level of 0.04 times that of gravity in the next fifty years. This compliance is possible via a stress transfer from the secondary load bearing posts 136 to the primary load bearing posts 138.

In some examples, the first access face 116(1) of the frame 114 may be arranged to receive fiber termination modules 140 in a left side column of the first access face of the frame 114 and fiber termination modules 140 in a right side column of the first access face of the frame 114. Similarly, the second access face 116(2) of the frame 114 may be arranged to receive fiber termination modules 140 in a left side column of the second access face of the frame 114 and fiber termination modules 140 in a right side column of the second access face of the frame 114. In one examples, a fiber termination module 140 may comprise a plurality of splice modules 118 (e.g., 18 fiber splice cassettes) arranged in a module in the left side column or the right side column of the first and/or second access faces of the frame 114. In another example, a fiber termination module 140 may comprise a plurality of patch modules 120 (e.g., 9 fiber patch trays) arranged in a module in the left side column or the right side column of the first and/or second access faces of the frame 114.

FIG. 1 illustrates that the tops and/or bottom profiles of the frames 114 may have notches 142 that provide and constitute part of a fiber routing/storage area. For example, each of the frames 114 may have a cross shaped top and/or bottom profile and when the frames 114 are arranged adjacent to each other in a row of frames 114, the neighboring notches of the two cross shaped top and/or bottom profiles of the frames 114 constitute the fiber routing/storage areas between the adjacent frames 114.

Illustrative Fiber Blocks

Figure 2:
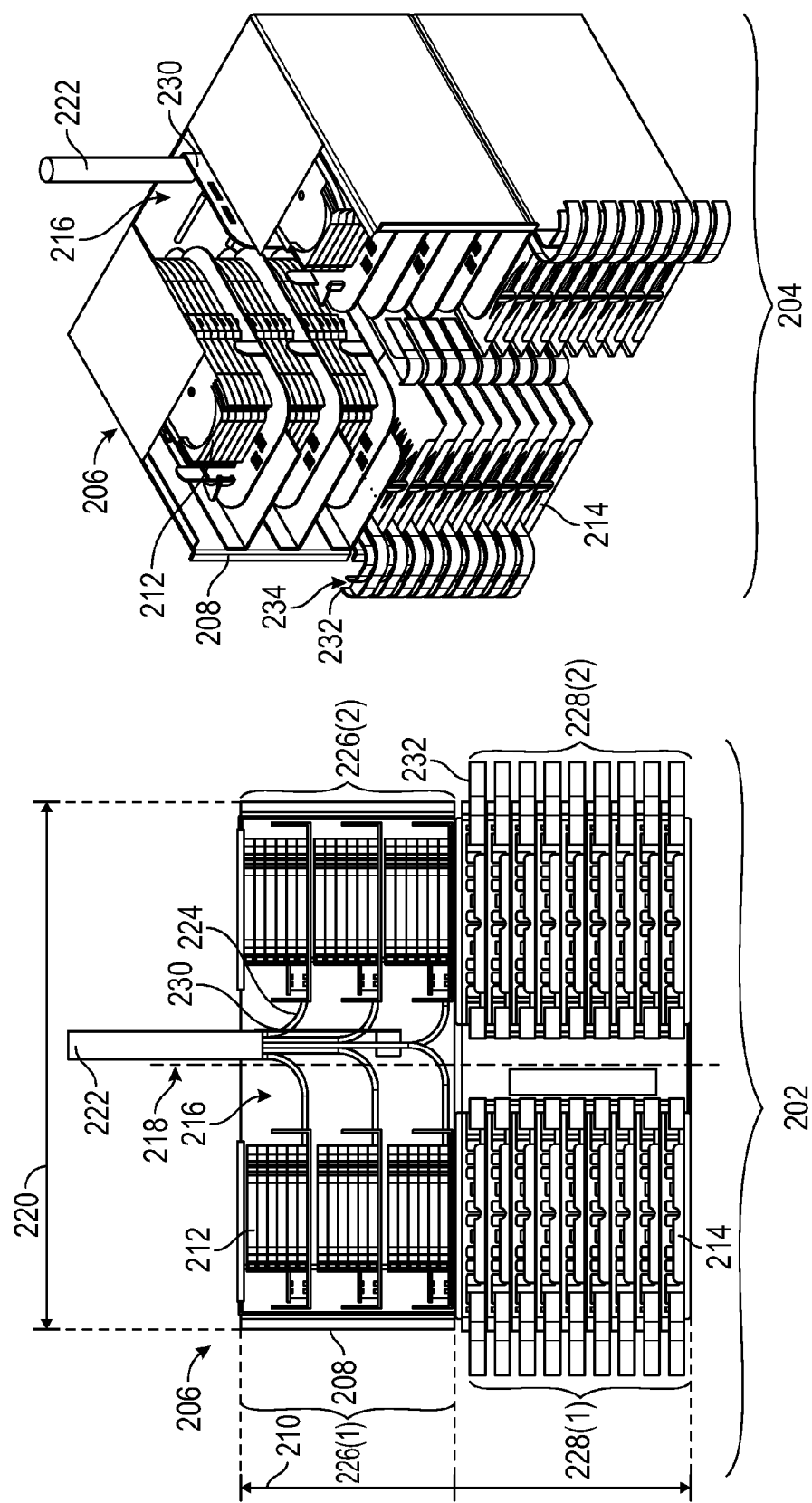
FIG. 2 illustrates a front view and a perspective view of an example fiber block receivable by the frame shown in FIG. 1.

FIG. 2 illustrates a front view 202 and a perspective view 204 of an example fiber block 206 receivable by the frame 114 shown in FIG. 1. For example, the fiber block 206 may be arranged to be received by the first access side 116(1) of the frame 114 or the second access side 116(1) of the frame 114 opposite the first access side 116(1) of the frame 114. FIG. 2 illustrates the fiber block 206 may include a chassis 208. In one example, the chassis 208 may have a height 210 of at least about 10 rack units (RUs) to at most about 12 RUs. In another example, the chassis 208 may have a height 210 of at least about 11 RUs.

FIG. 2 illustrates the fiber block 206 may include a plurality of splice trays 212 displaceably received in the chassis 208 and arranged to receive a quantity of fiber terminations. Fiber terminations in the splice tray may be contained in a splice clip comprising a foam or plastic part which a splice is inserted into, and the splice clip including sides arranged to clamp onto the splice and hold the splice in place and allow the splice to be removed if needed. In some examples, the fiber block 206 may include about 36 splice trays 212 (e.g., cassettes) that may be pre-terminated and routed for easy installation. In some examples, the fiber block 206 may include at least about 34 splice trays to at most about 38 splice trays. FIG. 2 illustrates the fiber block

206 may include a plurality of patch trays 214 displaceably received in the chassis 208 and arranged to receive the quantity of fiber terminations. For example, the fiber block 206 may include about 18 patch trays 214 that may be pre-terminated and routed for easy installation.

The fiber block 206 may include a fiber management bay 216 arranged substantially at a middle 218 of a width 220 of the chassis 208 and extending the height 210 of the chassis 208. The fiber management bay 216 may provide for managing a quantity of fiber terminations 222 (e.g., fiber cables). For example, the fiber block 206 may receive fiber terminations 222 (e.g., up to about 860 fiber terminations) and portions 224 of the fiber terminations 222 may be routed to each of the 36 splice trays 212. The patch trays 214 may then receive fiber terminations from the splice trays 212.

FIG. 2 illustrates a first portion 226(1) of the plurality of splice trays 212 may be arranged on a left side of the fiber management bay 216, and a second portion 226(2) of the plurality of splice trays 212 may be arranged on a right side of the fiber management bay 216. FIG. 2 illustrates a first portion 228(1) of the plurality of patch trays 214 may be arranged on a left side of the fiber management bay 216, and a second portion 228(2) of the plurality of patch trays 214 may be arranged on a right side of the fiber management bay 216.

The fiber block 206 may include at least one bar 230 arranged in the fiber management bay 216. The bar 230 may provide for restraining at least a portion of the quantity fiber terminations 222. FIG. 2 illustrates at least one side trough 232 arranged with at least one of the plurality of patch trays 214. The side trough 232 may be coupled to the chassis 208 and may have an exit 234 arranged on an outside of the chassis 208.

Figure 3:
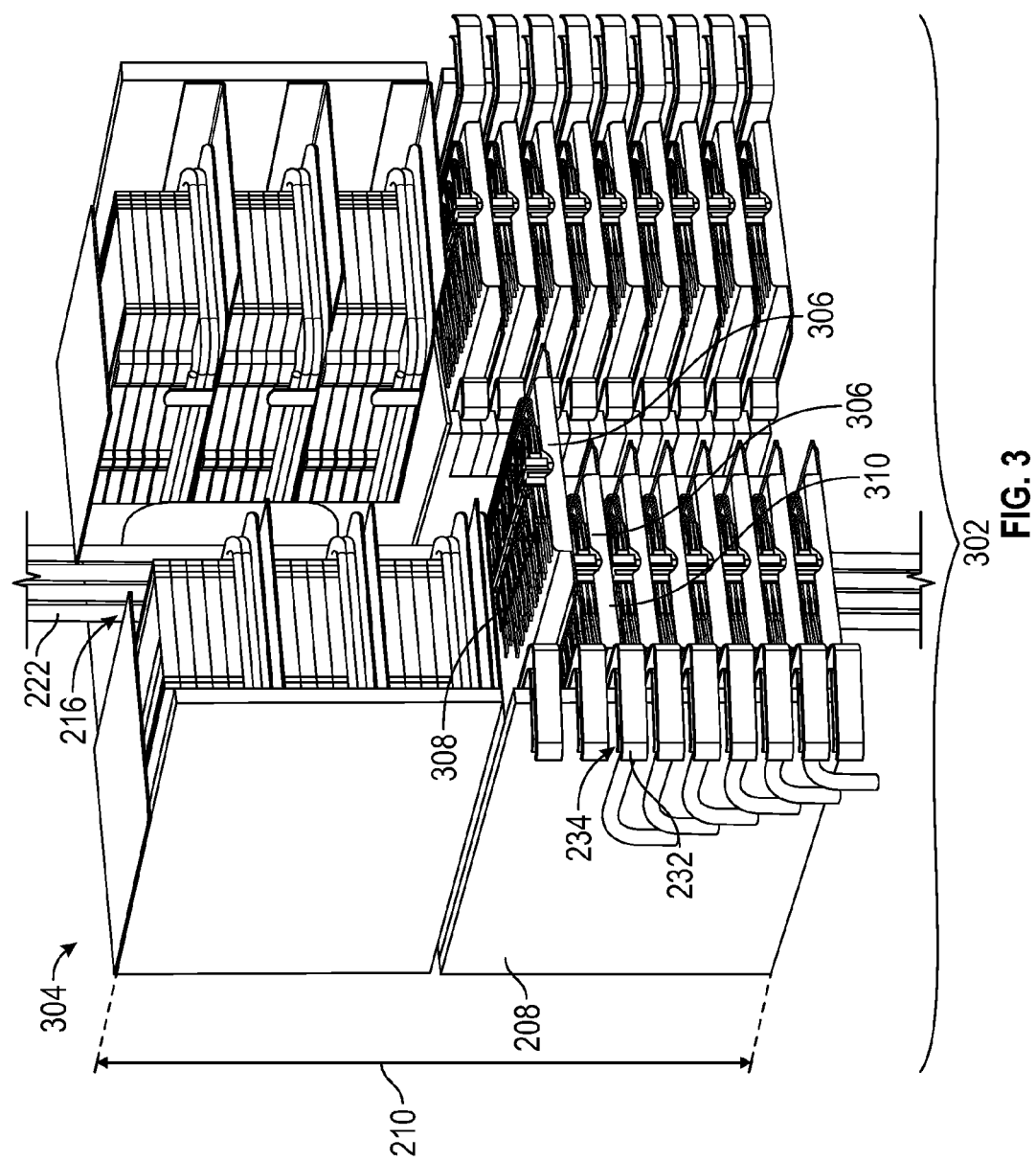
FIG. 3 illustrates a perspective view an example fiber block receivable by the frame shown in FIG. 1 with a tray in an open position.

FIG. 3 illustrates a perspective view 302 of an example fiber block 304. Similar to fiber block 206, fiber block 304 may be receivable by the frame 114 shown in FIG. 1. FIG. 3 illustrates the fiber block 304 may have a tray 306 (e.g., splice tray 212 or patch tray 214) in an open position 308. For example, when the fiber block 304 is received in the first access face 116(1) of the frame 114, the tray 306 may be arranged in front of the first access face 116(1) of the frame 114 when the tray is in the open position 308 and, when the tray 306 is in a stowed position 310 the tray 306 may be arranged in the first access face 116(1) of the frame 114. Further, when the fiber block 304 is received in the second access face 116(2) of the frame 114, the tray 306 may be arranged in front of the second access face 116(2) of the frame 114 when the tray is in the open position 308 and, when the tray 306 is in the stowed position 310 the tray 306 may be arranged in the second access face 116(2) of the frame 114.

FIG. 3 illustrates the fiber access management bay 216 may have capacity to receive at least about four fiber terminations 222 (e.g., up to about four units of 860 fiber terminations). In some examples, the first fiber termination may be received by the first fiber block arranged in the frame 114, the second fiber termination may be received by the second fiber block arranged in the frame 114, a third fiber termination may be received by the third fiber block arranged in the frame 114, and the fourth fiber termination may be received by the fourth fiber block arranged in the frame 114.

FIG. 3 illustrates fiber terminations exiting a plurality of side troughs 232. For example, the side troughs 232 may be stepped to provide for network jumpers exiting the plurality of side troughs in a substantially staggered pattern. For example, the side troughs 232 may have decreasing lengths arranged along the height 210 of the fiber block 304. Moreover, the side troughs 232 may have increasing gaps (e.g., distances) between the exits 234 and the chassis 208 arranged along the height 210 of the fiber block 304.

Illustrative Trays

Figure 4:
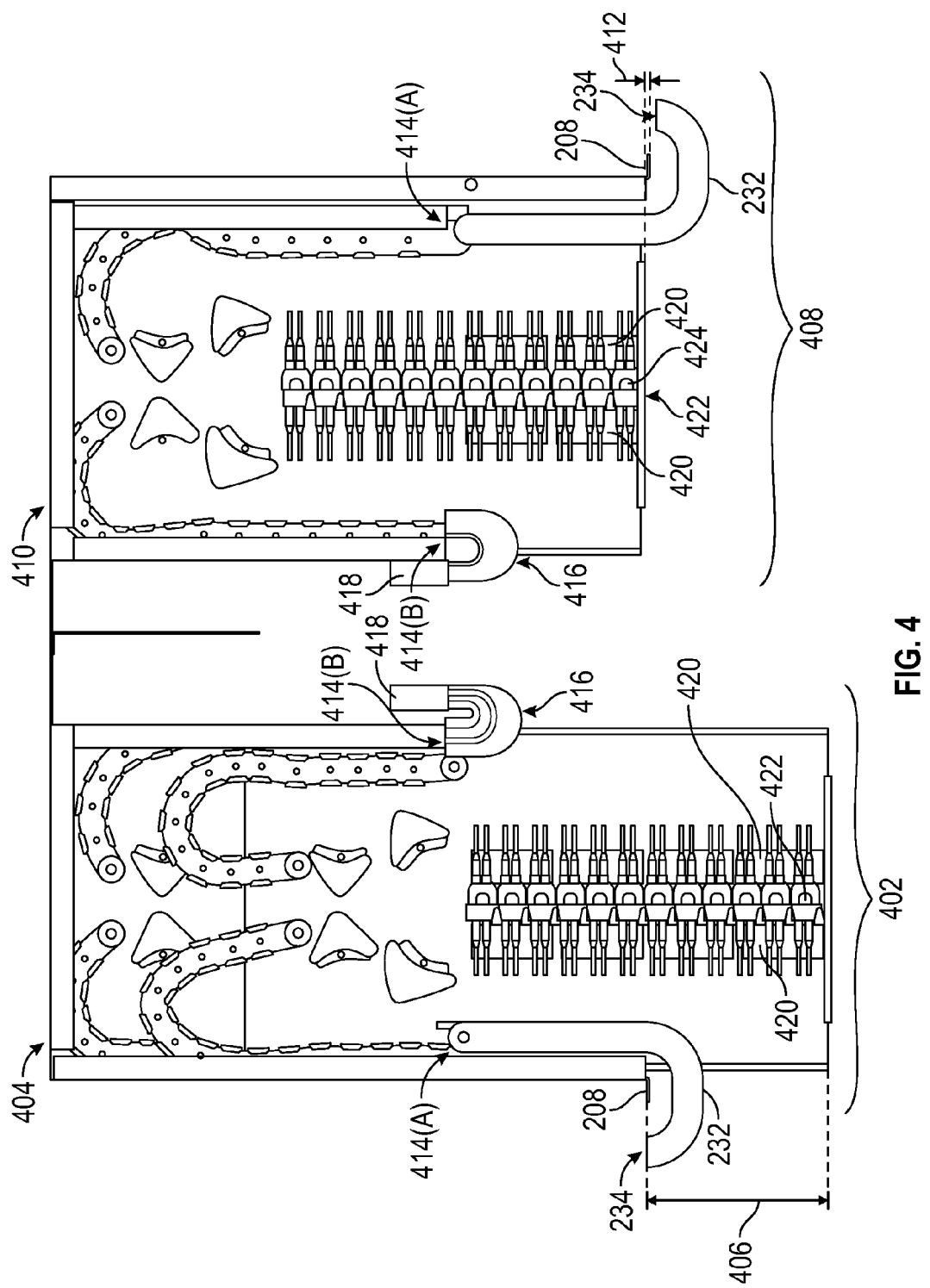
FIG. 4 illustrates top views of example trays received by a fiber block.

FIG. 4 illustrates a top view 402 of an example tray 404 (e.g., patch tray 214) in an open position 406, and a top view 408 of an example tray 410 in a stowed position 412. For example, the displaceable trays may be moveable (e.g., slideable) between the stowed position 412 and the open position 406, wherein when in the stowed position 412 a displaceable tray may be arranged a distance in the chassis 208 of a fiber block (e.g., fiber blocks 206 or 304) and when in the open position the displaceable tray may be arranged a distance in front of the chassis 208 of a fiber block.

FIG. 4 illustrates a side troughs 232 arranged with the trays 404 and 410. For example, the side troughs 232 may be coupled to the chassis 208 and may have an exit 234 arranged on an outside of the chassis 208. Flexible members 414(A) may be communicatively coupled to an end of the trough 232 opposite the exit 234 and coupled to trays 404 and 410. Flexible members 414(B) may be communicatively coupled to ends of side troughs 416 opposite breakout boxes 418 and coupled to the trays 404 and 410. The side troughs 416 may be coupled to the chassis 208 and the breakout boxes 418 may be arranged on the inside of the chassis 208. The flexible members 414(A) and 414(B) may comprise links and extend and compress to maintain bend radius of the fiber received by the flexible members 414(A) and 414(B).

The breakout boxes 418 of the side troughs 416 may provide for splitting at least a portion of the quantity of fiber terminations 222, and the flexible members 414(A) and 414(B) of side troughs 416 may be arranged to maintain a bend radius of the portion of the quantity of fiber terminations 222 when the trays 404 and 410 are displaced between the open 404 and the stowed position 410. In one example, the breakout boxes 418 of the side troughs 416 may provide for splitting the quantity of fiber terminations 222 to about 0.03 inches (900 micrometers (μm)). For example, the breakout boxes 418 may comprise one or more splitting blocks. Each splitting block having furcation tubes coupled to a first end of the splitting block. Jacketed fibers may communicatively couple to a second end of the splitting block opposite the first end of the block to communicatively couple the fibers in the furcation tubes in the first end of the block with the jacketed fibers in the second end of the block to split the quantity of fiber terminations 222 to about 0.03 inches (900 micrometers (μm)). In another example, the breakout boxes 418 may comprise one or more fiber fan out kits arranged in the breakout boxes to split the quantity of fiber terminations 222 to about 0.03 inches (900 micrometers (μm)). In another example, the breakout boxes 418 may comprise a set of empty jackets (e.g., zip-cord jackets) arranged to split the quantity of fiber terminations 222 to about 0.03 inches (900 micrometers (μm)). The breakout boxes may receive outside fiber and the exits 234 of the side troughs 232 may pass the patched outside fiber out to equipment and/or fiber management bays arranged between frames 114. In some examples, the output fiber at the exits 234 may be 0.08 inch (2 mm) output fiber, and the input fiber at the breakout boxes 418 may be 0.03 inch (900 micrometer (μm)) input fiber.

FIG. 4 illustrates apertures 420 arranged in the tray 404 and 410 along and below rows of adapters 422 to provide bottom access to the rows of adapters 422. For example, the rows of adapters 422 may include a row of output adapters arranged in the patch tray and a row of input adapters arranged in the patch tray adjacent to the row of output adapters. In some examples, at least one of the output adapters or the input adapters may comprise a pop-up adapter pack 424. The pop-up adapter pack 424 may include connectors (e.g., Lucent Connectors (LCs), subscriber connectors (SC), etc.), fixed to a displaceable plate.

Figure 5:
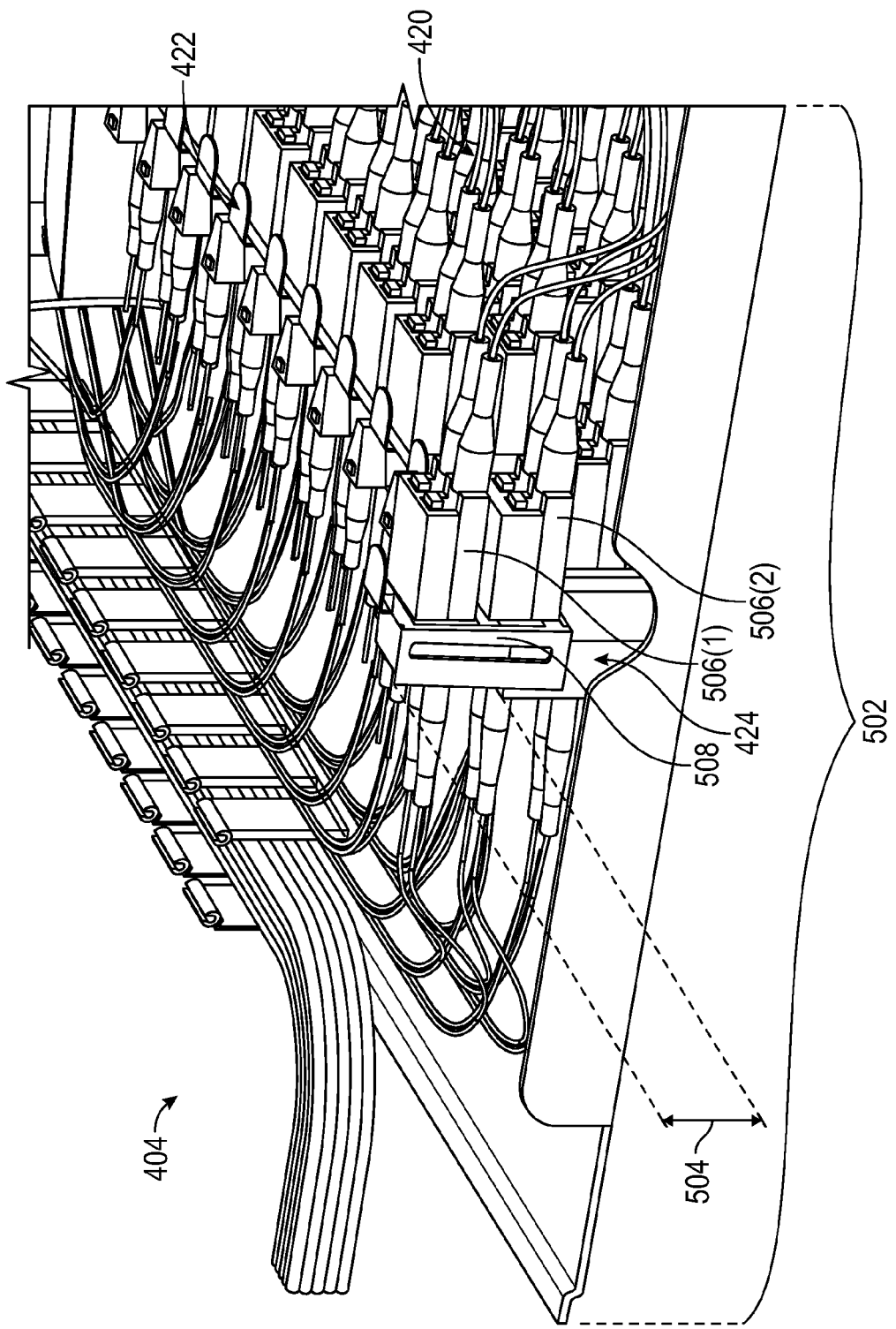
FIG. 5 illustrates a perspective view of the example tray shown in FIG. 4 with a pop-up adapter pack in an up position.

FIG. 5 illustrates a perspective view 502 of the tray 404 shown in FIG. 4 with the pop-up adapter pack 424 in an up position 504. For example, a user may selective pop-up the pop-up adapter pack 424 to displace the pop-up adapter pack 424 up a distance from the tray 404. The pop-up adapter pack 424 comprises a first pair of connectors 506(1) (e.g., Lucent Connectors (LCs)) fixed to a top of a displaceable plate 508 and stacked above a second pair of connectors 506(2) (e.g., LCs) fixed to a bottom of the displaceable plate 508. While FIG. 5 illustrates both of the first and second pair of connectors 506(1) and 506(2) having release mechanisms arranged towards the top of the displaceable plate 508, the first pair of connectors 506(1) fixed to the top of the displaceable plate 508 may have release mechanisms arranged toward the top of the displaceable plate 508, and the second pair of connectors 506(2) fixed to the bottom of the displaceable plate 508 may have release mechanisms arranged toward the bottom of the plate 508. Stated otherwise, the second pair of connectors 506(2) may be arranged in an inverted position so that the release mechanisms are arranged towards the bottom of the plate to provide access to the release mechanism via the aperture 418. FIG. 5 illustrates the apertures 420 arranged in the tray 404 along and below the row of adapters to provide bottom access to the row of pop-up adapter packs 424.

Figure 6:
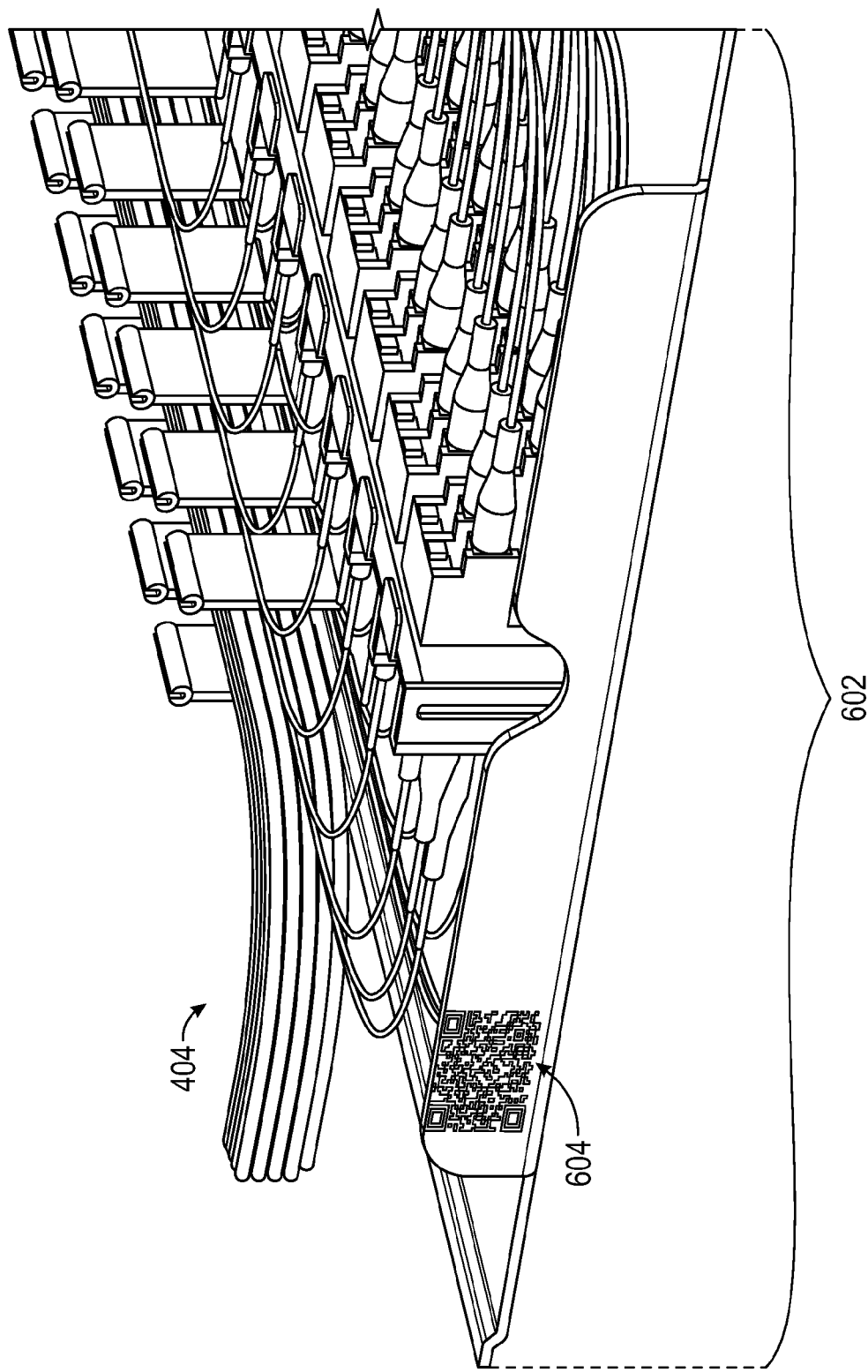
FIG. 6 illustrates a perspective view of the example tray shown in FIG. 4 with a machine-readable code arranged with the tray.

FIG. 6 illustrates a perspective view 602 of the example tray 404 shown in FIG. 4 with a machine-readable code 604 arranged with the tray 404. For example, the machine-readable code 604 may be arranged on a front of the plurality of splice trays or on the front of the plurality of patch trays to provide a user with a map of the fiber terminations in the chassis 208 and/or the frame 114. While FIG. 6 illustrates the machine-readable code 604 comprising a Quick Response Code (QR code) arranged on the front of the tray 404, the machine-readable code 604 may comprise a bar code, a Radio-frequency identification (RFID), universal product code (UPC), etc. The machine-readable code 604 may provide for managing connectivity information in data communication apparatus. For example, a user may scan the machine-readable code using a mobile device (e.g., hand scanner, smart phone, PDA, tablet, etc.). Upon receiving a machine-readable code arranged on or near a fiber termination module, a Graphical User Interface (GUI) may present information of a plurality of trays of the fiber termination module. Moreover, upon receiving an indication of a selection of a tray (e.g., by user selection of a graphic of the UI representing the tray), the GUI may display connectivity information of fiber terminations arranged in the selected tray. In this way, a user (e.g., an installer, a technician, a manager, an information systems technician, etc.) may manage the ultra-high density of fiber cables associated with the data communication apparatus. For example, because the frames of the data communication apparatus have capacity to receive at least about 4,000 fiber terminations—at least about 6,900 fiber terminations in some examples—, labeling real estate in the frames may be limited, and machine-readable codes may be used to provide connectivity information for the massive amounts of fiber terminations in the frames.

Illustrative Fiber Routing

Figure 7:
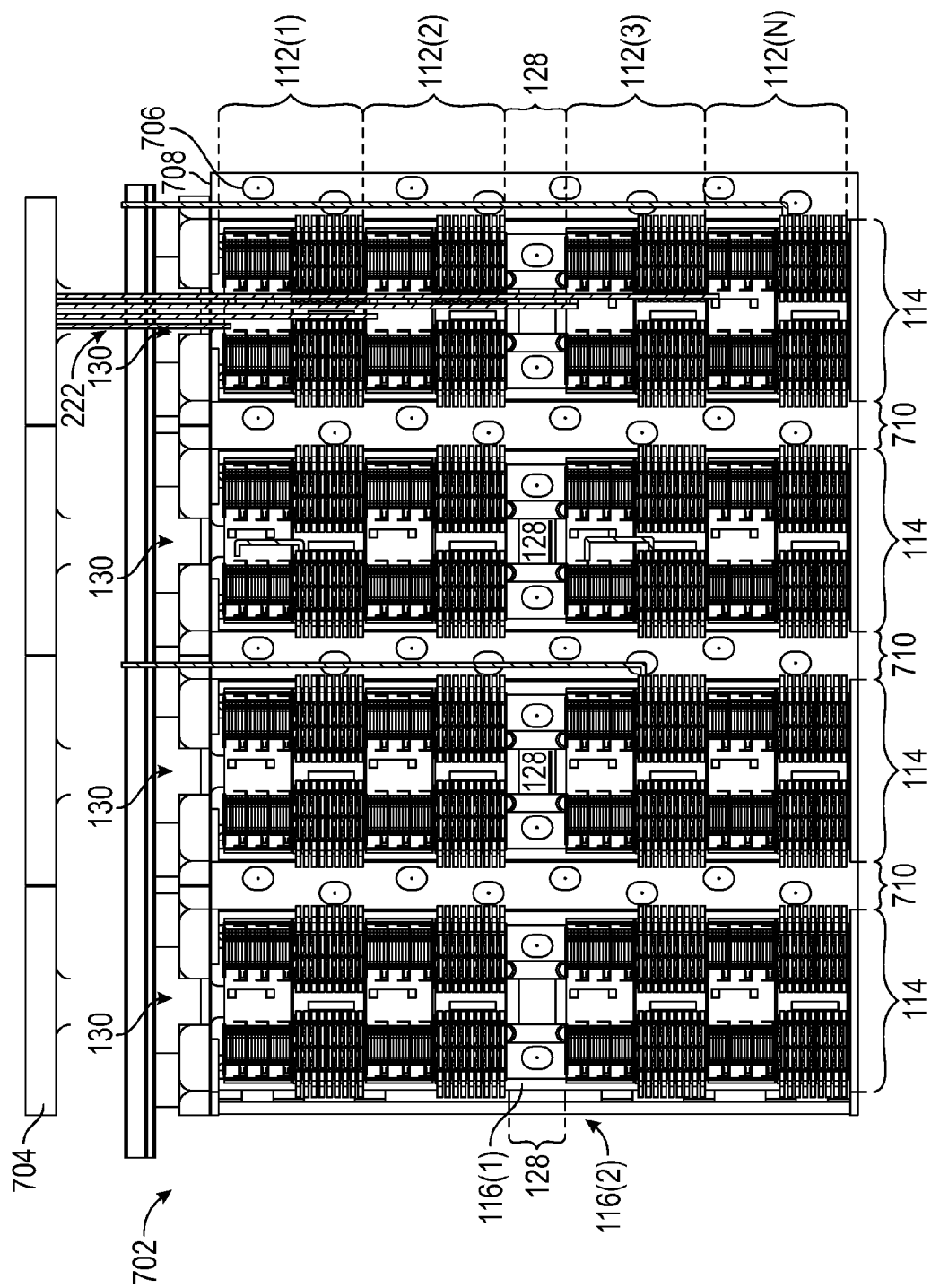
FIG. 7 illustrates a row of example data communication apparatus and interconnect fiber routing.

FIG. 7 illustrates a row of data communication apparatus 702 and interconnect fiber routing in the row of data communication apparatus 702. For example, a plurality of the frames 114 may be coupled to each other in a row in a data communication location and fibers (e.g., four fiber terminations 222 per access side 116(1) and 116(2)) may be received by each of the frames 114 in the row, patched in the frames 114, and then routed to a another data communication space. For example, the fibers may be routed from the row of frames 114 to another room with a switch. Stated another way, the fibers may be spliced and patched to another location.

FIG. 7 illustrates the pass through 128 of each of the frames 114 arranged from the first access side 116(1) to the second access side 116(2) to provide for passing fiber cables received at the first access side 116(1) to the second access side 116(2), and/or passing fiber cables received by the second access side 116(2) to the first access side 116(1). FIG. 7 illustrates the pass-through 130 of each of the frames 114 arranged from the tops 132 of the frames 114 to the first access sides 116(1) and/or to the second access sides 116(2). A fiber guide 702 may be arranged above the row of frames 702 that may provide the fiber cables to each of the frames 114. For example, a fiber guide may be suspended above and along input express off-ramps arranged above the frames 114 secured above the at least one pass-through 130 on the top 132 of the frame 114. In some examples, the fiber guide 702 may include off-ramps on both sides of the trough. In some examples, the off-ramps may provide for network jumpers to be received by the fiber guide.

FIG. 7 illustrates a spool 706 for storing and/or routing the fiber cables. For example, a plate 708 may be attached a left or right side of a frame 114 and the spool 706 may be coupled to the plate 708. As discussed above, in some examples, the tops and/or bottom profiles of the frames may have notches 142 that provide and constitute part of a fiber routing/storage area 710. For example, each of the frames 114 may have a cross shaped top and/or bottom profile and when the frames 114 are arranged adjacent to each other in the row of frames 702, the neighboring notches 142 of the two cross shaped top and/or bottom profiles of the frames 114 constitute the fiber routing/storage areas 710 between the adjacent frames 114. The plate 708 may be coupled in the storage areas 710 to protect the fiber cables. The spools 706 coupled to the plates 708 may provide for slack management of fiber lines for cross connect and/or interconnect fiber connections. In some examples, a spool may be arranged in the first half and/or in the second half for storing and/or routing fiber cables. While FIG. 7 illustrates about a 7 inch (18 centimeters) wide storage area 710, the storage area may be any width. For example, the storage area 710 may be about 16 inches (40 centimeters), 22 inches (56 centimeters), etc.

Figure 8:
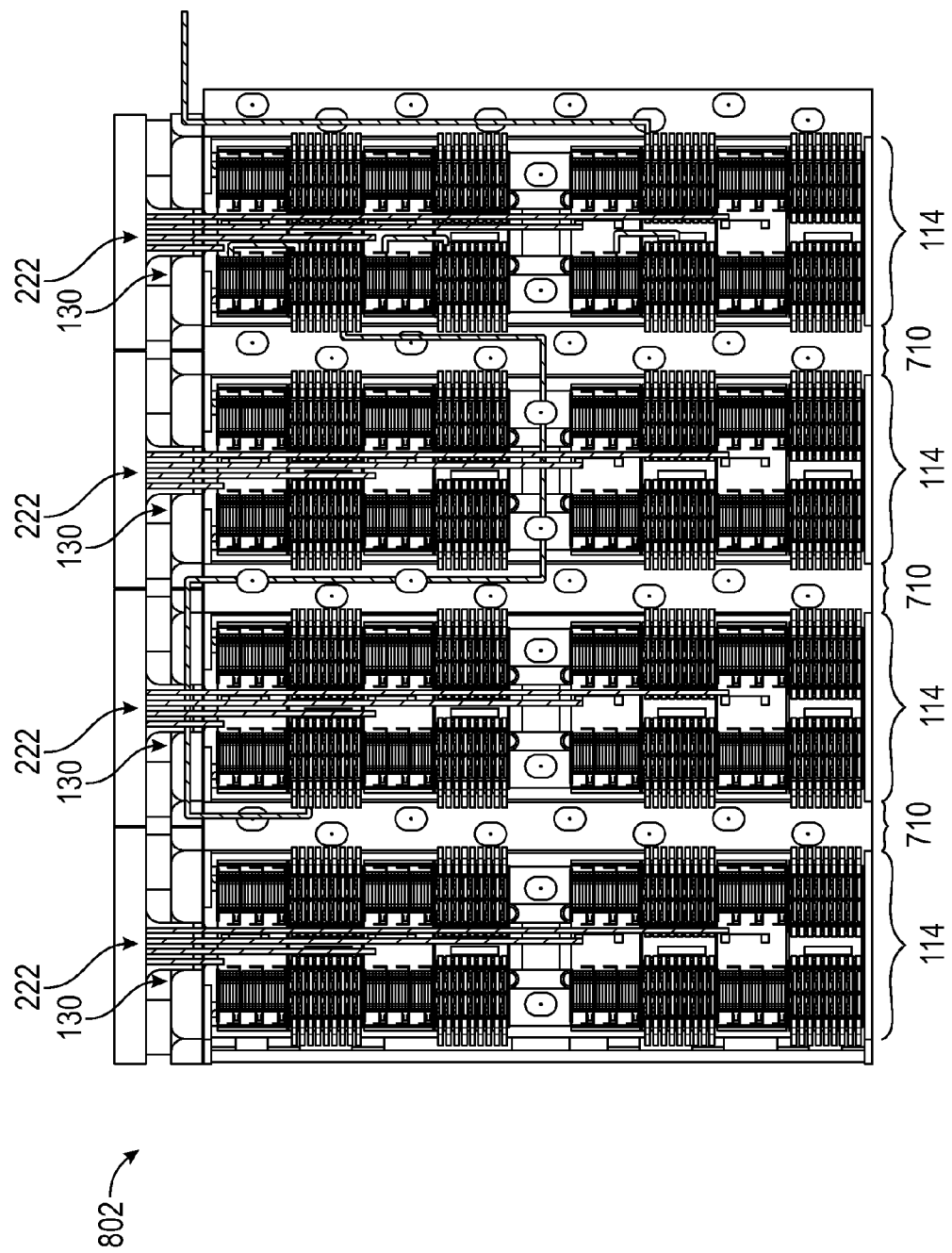
FIG. 8 illustrates a row of example data communication apparatus and cross connect fiber routing.

FIG. 8 illustrates a row of data communication apparatus 802 and cross connect fiber routing. For example, a plurality of the frames 114 may be coupled to each other in a row in a data communication location and fibers (e.g., four fiber terminations 222 per access side 116(1) and 116(2)) may be received by each of the frames 114 in the row, patched in the frames 114, and then routed to data communication equipment in the data communication location. For example, the fibers may be routed from one frame 114 in the row 802 to another frame 114 in the row 802. Stated another way, the fiber cables may be patched from one frame to another frame.

Illustrative Connectivity Management

Figure 9:
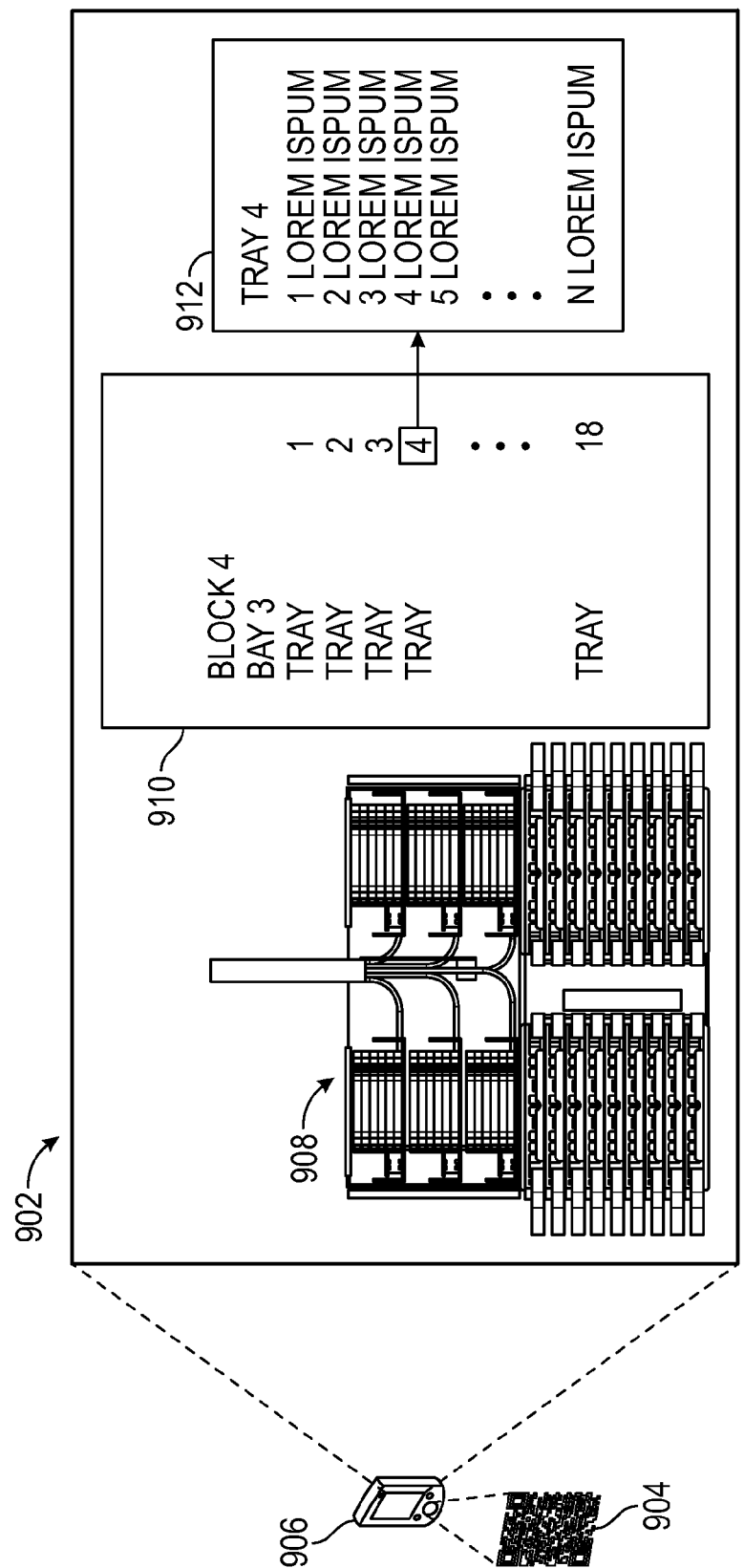
FIG. 9 illustrates a Graphical User Interface (GUI) for managing connectivity information.

FIG. 9 illustrates a Graphical User Interface (GUI) 902 for managing connectivity information. For example, each fiber block (e.g., fiber blocks 206) may be identified with a machine-readable code 904 that may provide for managing connectivity information of the data communication locations and/or data communication apparatuses. For example, a user may scan the machine-readable code 904 using a mobile device 906 (e.g., hand scanner, smart phone, PDA, tablet, etc.). Upon receiving the machine-readable code 904, the GUI 902 may present information of the plurality of trays (e.g., plurality of splice trays 212 and/or patch trays 214) arranged in the fiber block 206. For example, upon receiving the machine-readable code 904, the GUI 902 may present an image 908 of a block (e.g., block 112), and/or an interface 910 on a display of the device 906. For example, the GUI 902 may display the image 908 of a selected block, and display an interface 910 (discussed in more detail with respect to FIGS. 10(A), 10(B), 10(C) and 10(D)) to navigate a set of a plurality of trays that are present in the selected block. Moreover, upon selection of a tray, the GUI may display an image of the selected tray, and display an interface 912 to navigate a plurality of connections (e.g., patch connections) that are present in the selected tray. Further, upon receiving an indication of a selection of a tray (e.g., by user selection of a graphic of the UI representing the tray), the GUI may display connectivity information of fiber terminations arranged in the selected tray. In another example, each bay (e.g., first access face 116(1) or second access face 116(2)) may be identified with a machine-readable code 904. In the example where each bay (e.g., first access face 116(1) or second access face 116(2)) may be identified with a machine-readable code 904, upon receiving the machine-readable code 904, the GUI 902 may present information of the plurality of blocks (e.g., fiber blocks) arranged in the selected bay. The mobile device 906 may add the connectivity information identified with the machine-readable code 904 to a local storage of the mobile device. For example, the mobile device 906 may add the connectivity information identified with the machine-readable code 904 to a local storage of the mobile device as a list of "favorite" or "frequently accessed" fiber blocks, trays, and/or fiber terminations.

Figures 10A, 10B:
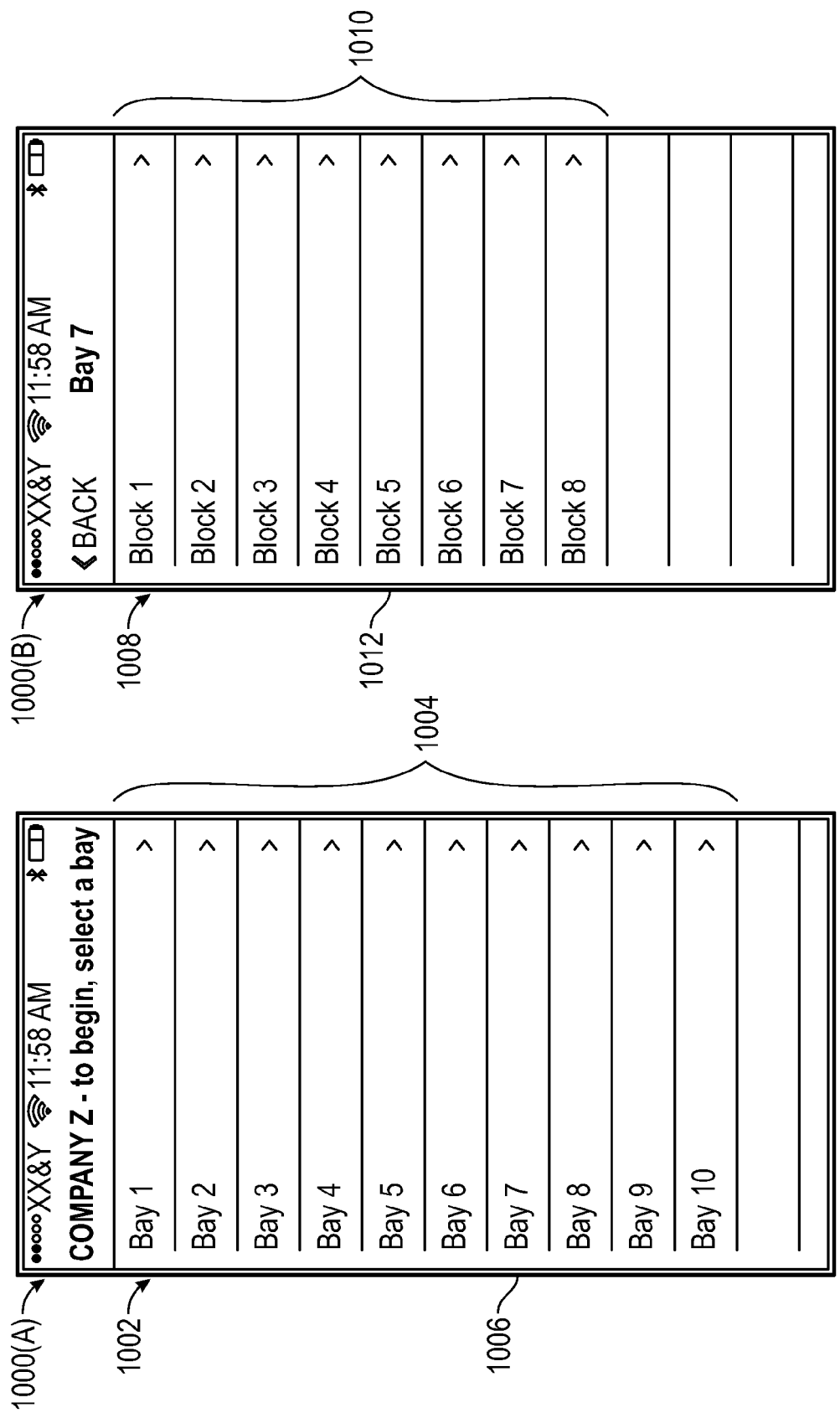

FIGS. 10(A), 10(B), 10(C), and 10(D) illustrate example interfaces for managing connectivity information. FIG. 10(A) illustrates an example interface 1000(A) to navigate a set of a plurality of bays (e.g., access faces 116(1) of frames 114) that are present at a data communication site (e.g., rows 702 and/or rows 802 of frames 114 at a site). The interface may include a navigation area 1002 for navigating through a bay dropdown list 1004. The bay dropdown list 1004 may provide selectable icons 1006 of bays that are present at the site.

FIG. 10(B) illustrates, upon selection of a bay icon 1006 (e.g., Bay 7), an example interface 1000(B) to navigate a set of a plurality of blocks (e.g., fiber blocks 112) that are present in the selected Bay 7. The interface may include a navigation area 1008 for navigating through a block dropdown list 1010. The block dropdown list 1010 may provide selectable icons 1012 of blocks that are present in the selected Bay 7.

FIG. 10(C) illustrates, upon selection of a block icon 1012 (e.g., Block 5), an example interface 1000(C) to navigate a set of a plurality of trays (e.g., splice trays 118 and/or patch trays 120) that are present in the selected Block 5. The interface may include a navigation area 1014 for navigating through a tray dropdown list 1016. The tray dropdown list 1016 may provide selectable icons 1018 of trays that are present in the selected Block 5.

FIG. 10(D) illustrates, upon selection of a tray icon 1018 (e.g., Tray 14), an example interface 1000(D) to navigate a plurality of connections (e.g., patch connections) that are present in the selected Tray 14. The interface may include a navigation area 1020 for navigating through a connection dropdown list 1022. The connection dropdown list 1022 may provide connectivity information of fiber terminations arranged in the selected tray 14.

Figure 11:
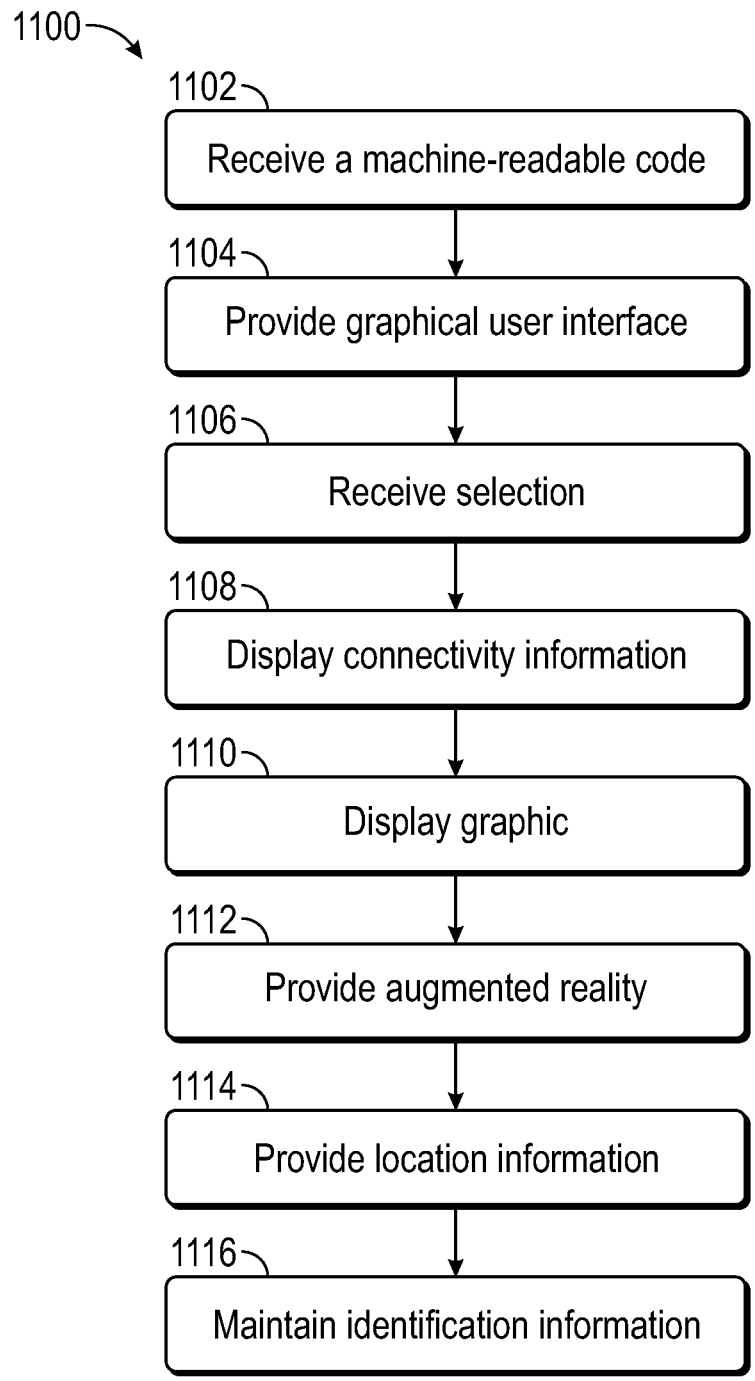
FIG. 11 illustrates an example method for managing connectivity information.

FIG. 11 illustrates a flowchart of an illustrative method 1100 of managing connectivity information. The method 1100 begins at 1102 with receiving a machine-readable code (e.g., machine-readable code 604 or 904) arranged with a fiber block (e.g., fiber block 112). For example, a user may scan the machine-readable code using a mobile device (e.g., hand scanner, smart phone, PDA, tablet, etc.). In this example where a user may scan the machine-readable code, the scanning operation of the machine-readable code may detect the machine-readable code. At 1104, upon receiving the machine-readable code, a Graphical User Interface (GUI) is provided. For example, at 1104, the GUI may present information of a plurality of trays (e.g., splice modules 118 and/or patch modules 120) of the fiber block. At 1106, a selection of a tray of the fiber block may be received via the GUI. At 1108, upon receiving an indication of the selection of the tray, connectivity information of fiber terminations arranged in the selected tray may be displayed in the GUI.

At 1110, the method 1100 may include displaying a graphic of the fiber block associated with the machine-readable code. The displayed graphic illustrating a plurality of splice trays displaceably received in the fiber block, and/or illustrating a plurality of patch trays displaceably received in the fiber block. At 1112, the method may include providing augmented reality to overlay a graphical representation of the connectivity information on an image of the fiber block. For example, photo, a schematic, computer generated model, etc. of the fiber block may be superimposed over an image of the fiber block. At 1114, the method may include providing location information of the fiber block. The location information may comprise Global Position System (GPS) information, Wi-Fi-based position system (WPS) information, mobile phone position information, etc. At 1116, the method may include maintaining identification information of the fiber block, the identification information being associated with the machine-readable code arranged with the fiber block. For example, a server, a remote server, a distributed network (e.g., cloud computing), a hand scanner, a smart phone, a PDA, a tablet, etc. may maintain or store identification information of the fiber blocks.

The process 1100 (as well as each process described herein) is illustrated as a logical flow graph, each operation of which represents a sequence of operations that can be implemented in hardware, software, or a combination thereof. In the context of software, the operations represent computer-executable instructions stored on one or more non-transitory computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the process.

CONCLUSION

Although the invention has been described in language specific to structural features and/or methodological acts, it is to be understood that the invention is not necessarily limited to the specific features or acts described. Rather, the specific features and acts are disclosed as illustrative forms of implementing the invention. For example, while embodiments are described having certain shapes, sizes, and configurations, these shapes, sizes, and configurations are merely illustrative.

What is claimed is:

1. A data communication apparatus comprising:
a frame having a first access side opposite a second access side;
a first plurality of fiber blocks received in the first access side of the frame;
a second plurality of fiber blocks received in the second access side of the frame;
at least one fiber block of the first plurality of fiber blocks or the second plurality of fiber blocks including:
a chassis;
a fiber termination module arranged in the chassis;
a tray displaceably received in the fiber termination module;
a side trough arranged with the tray;
a breakout box arranged on an inside of the chassis; and
a flexible member communicatively coupled to an end of the side trough opposite the breakout box and coupled to the tray;
wherein the first and second pluralities of fiber blocks collectively have capacity to receive at least about 4,000 fiber terminations, the breakout box provides for splitting at least a portion of the 4,000 fiber terminations, and the flexible member is arranged to maintain a bend radius of the portion of the 4,000 fiber terminations when the tray is displaced.

2. The data communication apparatus of claim 1, wherein the first plurality of fiber blocks received in the first access side of the frame splice and patch about half of the at least about 4,000 fiber terminations, and the second plurality of fiber blocks in the second access side of the frame splice and patch a remainder of the at least about 4,000 fiber terminations.

3. The data communication apparatus of claim 1, wherein the first and second pluralities of fiber blocks include splice modules and patch modules.

4. The data communication apparatus of claim 1, wherein the frame comprises a footprint having a width of about 30 inches (76 centimeters) and a depth of about 36 inches (91 centimeters).

5. The data communication apparatus of claim 1, wherein each fiber block of the plurality of fiber blocks has a width of about 23 inches (58 centimeters) and a height of at least about 10 rack units (RUs) to at most about 12 RUs.

6. A data communication apparatus comprising:
a frame having a first access face opposite a second access face,
the first access face of the frame arranged to receive a first chassis, the first chassis arranged to receive fiber termination modules in a left side column of the first access face of the frame and fiber termination modules in a right side column of the first access face of the frame, and
the second access face of the frame arranged to receive a second chassis, the second chassis arranged to receive fiber termination modules in a left side column of the second access face of the frame and fiber termination modules in a right side column of the second access face of the frame;
at least one displaceable tray received in at least one of the fiber termination modules received by the first chassis, the at least one displaceable tray moveable between a stowed position and an open position, wherein when in the stowed position the at least one displaceable tray is arranged in the first access face of the frame, and when in the open position the at least one displaceable tray is arranged in front of the first access face of the frame;
at least one side trough arranged with the at least one displaceable tray, the at least one side trough coupled to the first chassis and having a breakout box arranged on an inside of the first chassis, and a flexible member communicatively coupled to an end of the at least one side trough opposite the breakout box and coupled to the at least one displaceable tray, the breakout box of the at least one side trough to split at least a portion of a quantity of fiber terminations, and the flexible member of the at least one side trough to maintain a bend radius of at least the portion of the quantity of fiber terminations when the at least one displaceable tray is moveable between the stowed position and the open position;
a first fiber access management bay arranged between the left and right side columns of the first access face of the frame; and
a second fiber access management bay arranged between the left and right side columns of the second access face of the frame.

7. The data communication apparatus of claim 6, wherein the first and second fiber access management bays collectively have a capacity to receive at least about 6,900 fiber terminations, and wherein at least some of the 6,900 fiber terminations comprise Lucent Connector (LC) terminations.

8. The data communication apparatus of claim 6, wherein the first and second fiber access management bays collectively have a capacity to receive at least about 3,400 fiber terminations, and wherein at least some of the 3,400 fiber terminations comprise subscriber connector (SC) terminations.

9. The data communication apparatus of claim 6, wherein each of the fiber termination modules in the left and right side columns of the first access face of the frame are arranged to be accessed at the first access face of the frame, and each of the fiber termination modules in the left and right side columns of the second access face of the frame are arranged to be accessed at the second access face of the frame.

10. The data communication apparatus of claim 6, further comprising:
at least one pass-through arranged from the first fiber access management bay to the second fiber access management bay to provide for passing fiber cables received by the first fiber access management bay to the second fiber access management bay, or passing fiber cables received by the second fiber access management bay to the first fiber access management bay, or
at least one pass-through arranged from a top of the frame to the first fiber access management bay and to the second fiber access management bay to provide for the first fiber access management bay and to the second fiber access management bay to receive fiber cables.

11. The data communication apparatus of claim 10, further comprising a cable management unit secured above the at least one pass-through on the top of the frame to provide storage of at least a portion of fiber cables.

12. The data communication apparatus of claim 6, further comprising machine-readable code arranged on at least the first access face of the frame or the second access face of the frame, the machine-readable code associated with information about fibers, connections, and/or terminations in the frame.

13. A data communication apparatus comprising:
a fiber block including:
  a chassis having a height of at least about 10 rack units (RUs) to at most about 12 RUs and arranged to be received by a first access side of a frame or a second access side of the frame opposite the first access side of the frame;
  a first fiber termination module arranged in the chassis;
  a plurality of splice trays displaceably received in the first fiber termination module, the plurality of splice trays arranged to receive a quantity of fiber terminations;
  a second fiber termination module arranged in the chassis;
  a plurality of patch trays displaceably received in the second fiber termination module, the plurality of patch trays arranged to receive the quantity of fiber terminations;
  at least one side trough arranged with at least one of the plurality of patch trays, the at least one side trough coupled to the chassis and having a breakout box arranged on an inside of the chassis, and a flexible member communicatively coupled to an end of the at least one side trough opposite the breakout box and coupled to the at least one patch tray; and
  wherein the breakout box of the at least one side trough provides for splitting at least a portion of the quantity of fiber terminations, and the flexible member of the at least one side trough is arranged to maintain a bend radius of at least the portion of the quantity of fiber terminations when the at least one patch tray is displaced.

14. The data communication apparatus of claim 13, further comprising a fiber management bay arranged substantially at a middle of a width of the chassis and extending the height of the chassis, the fiber management bay to manage the quantity fiber terminations, wherein
  a first portion of the plurality of splice trays are arranged on a left side of the fiber management bay, and
  a second portion of the plurality of splice trays are arranged on a right side of the fiber management bay.

15. The data communication apparatus of claim 14, wherein a first portion of the plurality of patch trays are arranged on the left side of the fiber management bay, and
  a second portion of the plurality of patch trays are arranged on the right side of the fiber management bay.

16. The data communication apparatus of claim 13, further comprising at least one side trough arranged with at least one of the plurality of patch trays, the at least one side trough fixed to the chassis and having an exit arranged on an outside of the chassis.

17. The data communication apparatus of claim 16, further comprising a flexible member communicatively coupled to an end of the at least one side trough opposite the exit and coupled to the at least one patch tray, and
  wherein the exit provides for at least a portion of the quantity of fiber terminations to exit the chassis, and the flexible member is arranged to maintain a bend radius of at least the portion of the quantity of fiber terminations when the at least one patch tray is displaced.

18. The data communication apparatus of claim 13, wherein at least one of the plurality of patch trays comprises a row of output adapters arranged in the patch tray and a row of input adapters arranged in the patch tray adjacent to the row of output adapters, at least one of the output adapters or the input adapters comprising a pop-up adapter pack.

19. The data communication apparatus of claim 18, wherein the pop-up adapter pack comprises a first pair of Lucent Connectors (LCs) fixed to a top of a displaceable plate and stacked above a second pair of LCs fixed to a bottom of the displaceable plate,
  wherein the first pair of LCs is fixed to the top of the displaceable plate having release mechanisms of the first pair of LCs arranged toward the top of the displaceable plate, and the second pair of LCs is fixed to the bottom of the displaceable plate having release mechanisms of the second pair of LCs arranged toward the bottom of the plate.

20. The data communication apparatus of claim 18, further comprising an aperture arranged in the at least one patch tray along and below the row of output adapters to provide bottom access to the row of output adapters.

21. A data communication apparatus comprising:
a fiber block including:
  a chassis having a height of about 11 rack units (RUs) and arranged to be received by a frame;
  a fiber termination module arranged in the chassis; and
  a plurality of patch trays displaceably received in the fiber termination module, the plurality of patch trays arranged to receive a quantity of fiber terminations, the plurality of patch trays being accessible from a same side of the chassis,
  at least one of the plurality of patch trays including a row of output adapters arranged in the patch tray and a row of input adapters arranged in the patch tray adjacent to the row of output adapters, at least one of the output adapters or the input adapters having a pop-up adapter pack, the pop-up adapter pack including a first pair of connectors fixed to a top of a displaceable plate and stacked above a second pair of connectors fixed to a bottom of the displaceable plate, and
  wherein the first pair of connectors is fixed to the top of the displaceable plate having release mechanisms of the first pair of connectors arranged toward the top of the displaceable plate, and the second pair of connectors is fixed to the bottom of the displaceable plate having release mechanisms of the second pair of connectors arranged toward the bottom of the plate.

22. The data communication apparatus of claim 21, wherein the quantity of fiber terminations received by the plurality of patch trays is at least about 864 fiber terminations.

23. The data communication apparatus of claim 21, wherein the chassis comprises a width of about 23 inches (58 centimeters).

* * * * *